United States Patent
Sicard et al.

(10) Patent No.: US 9,606,567 B2
(45) Date of Patent: Mar. 28, 2017

(54) METHOD AND APPARATUS FOR PROVIDING ELECTRICAL ISOLATION

(71) Applicants: Thierry Sicard, Auzeville Tolosane (FR); Philippe Perruchoud, Tournefeuille (FR)

(72) Inventors: Thierry Sicard, Auzeville Tolosane (FR); Philippe Perruchoud, Tournefeuille (FR)

(73) Assignee: NXP USA, Inc., Austin, TN (US)

( * ) Notice: Subject to any disclaimer, the term of this patent is extended or adjusted under 35 U.S.C. 154(b) by 0 days.

(21) Appl. No.: 14/434,414

(22) PCT Filed: Jan. 7, 2013

(86) PCT No.: PCT/IB2013/000315
§ 371 (c)(1),
(2) Date: Apr. 9, 2015

(87) PCT Pub. No.: WO2014/057318
PCT Pub. Date: Apr. 17, 2014

(65) Prior Publication Data
US 2015/0234415 A1    Aug. 20, 2015

(30) Foreign Application Priority Data

Oct. 10, 2012 (WO) .................. PCT/IB2012/002332

(51) Int. Cl.
*H03K 17/06*      (2006.01)
*G05F 5/00*       (2006.01)
*H03K 17/04*      (2006.01)

(52) U.S. Cl.
CPC ..................................... *G05F 5/00* (2013.01)

(58) Field of Classification Search
CPC .... H02M 3/156; H02M 3/157; H05K 1/0231; H05K 1/162; H01L 2924/19041; H03K 17/06; H03K 17/04; H03K 2217/0054
See application file for complete search history.

(56) References Cited

U.S. PATENT DOCUMENTS

| 4,170,740 A | 10/1979 | Pernyeszi |
| 5,909,138 A | 6/1999 | Stendahl |

(Continued)

FOREIGN PATENT DOCUMENTS

| EP | 2 242 223 A1 | 10/2010 |
| GB | 2280320 A | 1/1995 |

(Continued)

OTHER PUBLICATIONS

Von Daak Met Al: "Isolated Capacitively Coupled MOS Driver Circuit with Bidirectional Signal Transfer", Power Electronics Specialists Conference, 1998. PESC 98 Record. 29th Annual IEEE Fukuoka, Japan May 17-22, 1998, New York, NY, USA, IEEE, US, vol. 2, May 17, 1998, pp. 1208-1213.

(Continued)

*Primary Examiner* — Gary L Laxton
(74) *Attorney, Agent, or Firm* — Charlene R. Jacobsen (57) ABSTRACT

An isolation circuit arranged to provide electrical isolation between at least one control module and at least one driver module. The isolation circuit comprises at least one boost circuit arranged to receive at least one control signal from the at least one control module, and boost the at least one control signal from a first voltage level signal to an increased voltage level signal. The isolation circuit further comprising at least a first capacitive isolation component comprising a first electrically conductive element and at least one further electrically conductive element formed from at least a part of printed circuit board layer, the first and at least one further electrically conductive elements being electrically isolated (Continued)

with respect to one another and arranged to comprise capacitive characteristics there between.

16 Claims, 7 Drawing Sheets

(56) References Cited

U.S. PATENT DOCUMENTS

| | | |
|---|---|---|
| 6,271,709 B1 | 8/2001 | Kimura et al. |
| 7,741,896 B2 | 6/2010 | Chow et al. |
| 8,198,951 B2 * | 6/2012 | Dong ................. H01L 23/48 333/12 |
| 8,994,413 B2 | 3/2015 | Kanschat et al. |
| 2002/0172351 A1 | 11/2002 | Beutler et al. |
| 2004/0212415 A1 | 10/2004 | Sutherland et al. |
| 2011/0031979 A1 | 2/2011 | Gillberg et al. |
| 2012/0047300 A1 | 2/2012 | Buteau |
| 2012/0161852 A1 | 6/2012 | Curbelo et al. |
| 2013/0106469 A1 | 5/2013 | Slavov et al. |
| 2013/0107584 A1 | 5/2013 | Li et al. |
| 2013/0293287 A1 * | 11/2013 | Zhu .......................... H02M 1/08 327/538 |
| 2014/0028369 A1 * | 1/2014 | Fang ......................... H03L 5/00 327/312 |

FOREIGN PATENT DOCUMENTS

| | | |
|---|---|---|
| WO | WO-2004/090737 A2 | 10/2004 |
| WO | WO-2013/102778 A1 | 7/2013 |
| WO | WO-2015/075497 A1 | 5/2015 |

OTHER PUBLICATIONS

International Search Report and Written Opinion correlating to PCT/IB2013/000315 dated Jun. 20, 2013.
Notice of Allowance for U.S. Appl. No. 15/037,473 mailed Oct. 26, 2016.

* cited by examiner

METHOD AND APPARATUS FOR PROVIDING ELECTRICAL ISOLATION

FIELD OF THE INVENTION

The field of this invention relates to a method and apparatus for providing electrical isolation, and in particular to a method and apparatus for providing electrical isolation between at least one control module and at least one high voltage driver module.

BACKGROUND OF THE INVENTION

Figure 1:
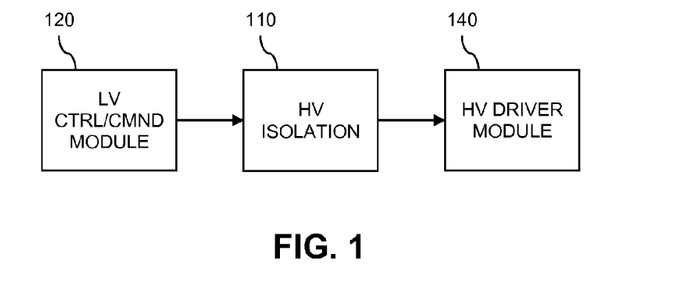
FIG. 1 illustrates a simplified block diagram of an example of a high voltage driver application.

In the field of high voltage electronic devices, it is known to implement high voltage (e.g. ~1500V) isolation between a low voltage (e.g. ~5V) control integrated circuit (IC) device and a high voltage output driver module. Such isolation is required in order to avoid shorting between the high voltage output and the low voltage control circuitry. FIG. 1 illustrates a simplified block diagram of an example of a high voltage driver application in which high voltage isolation, illustrated generally at 110, is provided between a low voltage control module 120 and a high voltage driver module 130 for driving a high voltage output (not shown).

Typically, such high voltage isolation 110 is implemented using galvanic isolation. Galvanic isolation is a principle of isolating functional sections of electrical systems to prevent current flow; no metallic conduction path is permitted. Energy or information can still be exchanged between the sections by other means, such as capacitance, induction or electromagnetic waves, or by optical, acoustic or mechanical means.

In a conventional capacitance solution, a high voltage capacitor is provided between the low voltage control module 120 and the high voltage driver module 130, for example mounted on a printed circuit board (PCB). A problem with using such a conventional capacitor to provide isolation between the control module 120 and the high voltage driver module 130 is that any short with, say, solder between each terminal of the capacitor could be critical. Another issue is the high voltage capacitor needed to provide the required isolation (e.g. >1500V), which are typically large and expensive.

A typical inductive/electromagnetic galvanic isolation implementation comprises the use of a transformer or similar device which uses electromagnetic fields to convey control signals from the control module 120 to the high voltage driver module 130. Such magnetic devices achieve high voltage isolation by employing opposing inductively coupled coils. However, a problem with such devices is that they typically require high power levels (especially when high data rates are required), and typically require the use of at least three separate integrated circuit devices. As such, such implementations are typically inefficient in terms of both size and power consumption. Furthermore, such magnetic devices are susceptible to electromagnetic interference.

An alternative known galvanic isolation implementation comprises the use of optical devices, which achieve high voltage isolation by employing, for example, light emitting diodes (LEDs) or the like and corresponding photodiodes to transmit and receive control signals as light signals. However, such optical solutions also require high power levels, and suffer from operational and design constraints when multiple communication channels are required.

SUMMARY OF THE INVENTION

The present invention provides an isolation circuit arranged to provide electrical isolation between at least one control module and at least one driver module, a high voltage device comprising such an isolation circuit, a high voltage driver module comprising at least a first input arranged to be operably coupled to a control module via such an isolation circuit and a method for providing electrical isolation between at least one control module and at least one driver module as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

The present invention will now be described with reference to the accompanying drawings, and in particular with reference to an example of a method and apparatus for providing electrical isolation between a control module and a differential driver module for driving a high voltage device, such as an IGBT (insulated-gate bipolar transistor) device. However, it will be appreciated that the present invention is not limited to the specific example herein described with reference to the accompanying drawings. For example, the present invention is not limited to being implemented within a differential driver implementation. Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 2:
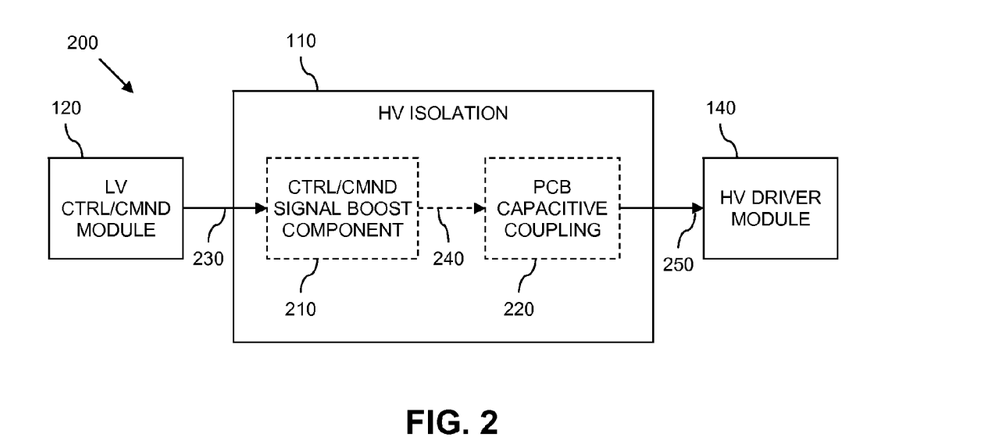
FIG. 2 illustrates a simplified block diagram of an example of a part of a high voltage device.

Referring first to FIG. 2, there is illustrated a simplified block diagram of an example of a part of a high voltage device 200 comprising isolation circuit 110 arranged to provide electrical isolation between at least one control module 120 and at least one driver module 140, which in the illustrated example comprises a high voltage driver module, such as for driving an IGBT device. In the illustrated example, the isolation circuit 110 comprises a boost circuit 210 arranged to receive a control signal 230 from the control module 120, and to boost the control signal 230 from a first voltage level signal to an increased voltage level signal 240. The isolation circuit 110 further comprises at least one capacitive isolation module 220 arranged to capacitively couple the boosted control signal 240 to an input 250 of the high voltage driver module 140.

Figure 3:
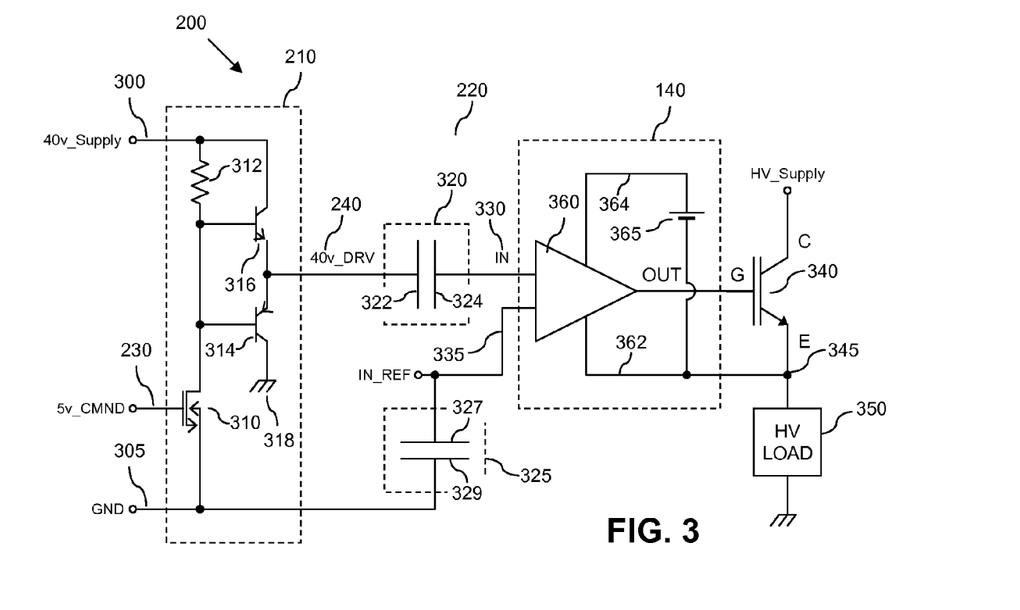
FIG. 3 illustrates a simplified circuit diagram of a more detailed example of the part of the high voltage device of FIG. 2.

Referring now to FIG. 3, there is illustrated a simplified circuit diagram of a more detailed example of the part of the high voltage device 200 of FIG. 2. In the example illustrated in FIG. 3, a driver module 140 is arranged to drive an insulated-gate bipolar transistor (IGBT) device 340, where the IGBT device 340 provides a power switching function for a high voltage load 350.

In the example illustrated in FIG. 3, a boost circuit, for example boost circuit 210 of FIG. 2, is arranged to receive a control signal 230 received from the control module 120 comprising an integrated circuit supply voltage level for the control module 120, which in the illustrated example comprises a 5V voltage level (i.e. comprises a peak amplitude of approximately 5V). The 5V control signal 230 is provided to a gate terminal of an NMOS (negative channel metal oxide semiconductor) transistor device 310. A source terminal of the NMOS device 310 is operably coupled to a ground plane 305, whilst a drain terminal of the NMOS device 310 is operably coupled, via a resistance 312, to a supply voltage, which in the illustrated example comprises a 40V voltage supply 300.

In this manner, when a positive voltage is applied to the gate terminal (e.g. greater than a saturation threshold voltage relative to that of the source terminal) of the NMOS device 310, the NMOS device 310 is biased into an active mode, allowing current to flow there through, pulling the voltage level at the drain terminal down to the ground voltage level. Conversely, when a low or negative voltage is applied to the gate terminal (e.g. less than an activation threshold voltage relative to that of the source terminal) of the NMOS device 310, the NMOS device 310 is biased into a cut-off mode, preventing current flow there through. As a result, when such a low or negative voltage is applied to the gate terminal of the NMOS device 310, the drain terminal of the NMOS device 310 is pulled up to the voltage level of the 40V voltage supply 300 via the resistance 312.

In the illustrated example, the boost circuit 210 further comprises a PNP bipolar transistor 314 and an NPN bipolar transistor 316. A base terminal of each of the PNP bipolar transistor 314 and the NPN bipolar transistor 316 is operably coupled to the drain terminal of the NMOS device 310. A collector of the NPN bipolar transistor 316 is operably coupled to the 40V voltage supply 300, whilst a collector terminal of the PNP bipolar transistor 314 is operably coupled to a ground plane 318, which in the illustrated example comprises a separate ground plane to the ground plane 305. Emitter terminals of the PNP bipolar transistor 314 and the NPN bipolar transistor 316 are coupled together, and are arranged to output the boosted control signal 240.

In the context of this example, the boost circuit 210 is arranged to boost a rate of voltage change (dV/dt) of the signal driving a first capacitive isolation component 320. It is known that the dV/dt generated by the IGBT commutation may reach values of up to 10 kV/us, which is predominantly removed by the differential comparator (common mode) 360. In this manner, only a small dV/dt difference may be present if both first and second capacitive isolation components 320, 325 have any mismatch value.

In one example, in order to solve the potential matching problem, the highest dV/dt possible may be used to drive the first capacitive isolation component 320. In one example, it may be possible to generate a dV/dt of a similar order as the parasitic dV/dt (for example in a range of 10 kV/us) when using an available voltage of the circuit (which in some examples may be up to 300V notwithstanding the illustrated 40V being used for NMOS cost vs. performance reasons).

In the illustrated example, different ground planes may be used dependent upon the application. For example, the high voltage power ground may be connected to the main power battery (for example 300V). The control circuitry may be configured to use, say, another 12V supply provided by, say, a DC/DC converter, so long as both grounds are arranged not to be floating.

In some examples of the invention, the boost circuit 210 may be optional and thus may not be implemented, as the described concepts work equally well without the bipolar stages.

Thus, in the illustrated example, when the drain terminal of the NMOS device 310 is pulled low (e.g. when a voltage is applied to the gate terminal of the NMOS device 310 greater than a saturation threshold voltage relative to that of the source terminal of the NMOS device 310), the PNP bipolar transistor 314 is biased into an active mode, allowing current to flow there through. In contrast, the NPN bipolar transistor 316 is biased into a cut-off mode, preventing current flow there through. As such, when the drain terminal of the NMOS device 310 is pulled low, the output 240 of the boost circuit 210 is pulled down to the ground plane 318 via the PNP bipolar transistor 314. Conversely, when the drain terminal of the NMOS device 310 is pulled high (i.e. when a voltage is applied to the gate terminal of the NMOS device 310 less than an activation threshold voltage relative to that of the source terminal of the NMOS device 310), the PNP bipolar transistor 314 is biased into a cut-off mode, preventing current flow there through. In contrast, the NPN bipolar transistor 316 is biased into an active mode, allowing current flow there through. As such, when the drain terminal of the NMOS device 310 is pulled high, the output 240 of the boost circuit 210 is pulled up to the 40V supply voltage 300.

Figure 4:
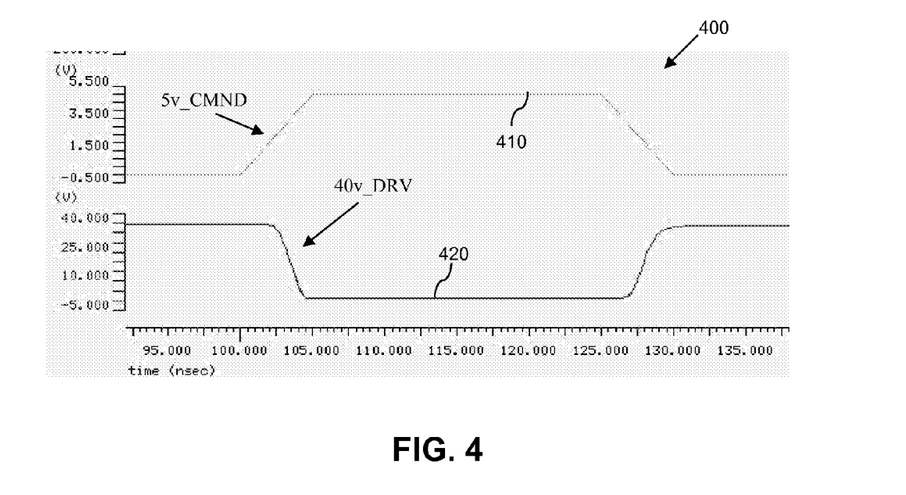
FIG. 4 illustrates a simplified graph illustrating an example simulation of voltage against time for a control signal output by a control module, and an example simulation of voltage against time for a signal output by a boost circuit.

FIG. 4 illustrates a simplified graph 400 comprising a first plot 410 illustrating an example simulation of voltage against time for the 5V control signal 230 output by the control module 120, and a second plot 420 illustrating an example simulation of voltage against time for the signal output by the boost circuit 210 illustrated in FIG. 3 comprising the boosted control signal 240. As can be seen in FIG. 3, in the illustrated example the boosted control signal 240 comprises an inverted representation of the 5V control signal 230 output by the control module 120, and comprising a voltage amplitude that has been boosted substantially up to the supply voltage level of the boost converter 120, which in the illustrated example comprises approximately 40V voltage level.

In some examples of the present invention, the concept is not limited to boosting the control signal to a boosted control signal comprising a voltage amplitude of 40V, and that any suitable boosted voltage amplitude may be implemented. In one example boosting a rate of voltage change (dV/dt) of the signal driving the first capacitive isolation component 320 may be achieved by driving the gate of the NMOS device 310 as fast as possible (for example using a fast MOS gate driver). In this manner, by increasing the drain voltage of the NMOS device 310 a higher dV/dt may be achieved due to the increase in voltage swing.

Figure 5:
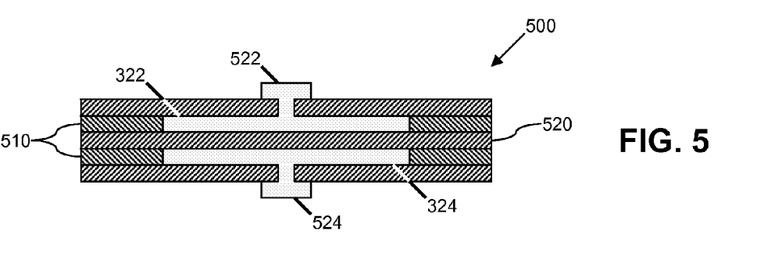
FIG. 5 illustrates a simplified block diagram of electrically conductive elements being formed within layers of a printed circuit board.

Referring back to FIG. 3, the capacitive isolation module 220 comprises the first capacitive isolation component 320 comprising a first electrically conductive element 322 formed from at least a part of first printed circuit board (PCB) layer, and a further electrically conductive element 324 formed from at least a part of at least one further PCB layer. The first and further electrically conductive elements 322, 324 are electrically isolated with respect to one another and arranged to comprise capacitive characteristics there between. For example, and as illustrated in FIG. 5, the electrically conductive elements 322, 324 of the first capacitive isolation component 320 may be formed from non-adjacent internal layers 510 of a PCB 500, which in the illustrated example are at least partially overlapping. In this manner, the electrically conductive elements 322, 324 form a capacitive structure, with one or more non-conductive substrate layer(s) 520 between the electrically conductive elements 322, 324 providing a 'dielectric' layer there between. As can be seen in FIG. 5, by utilising such a capacitive structure formed from the internal PCB layers, the likelihood of shorting between each terminal of the capacitor is significantly reduced. In some examples, it is contemplated that each electrically conductive element 322, 324 may comprise an area of, say, 1 mm$^2$, providing the capacitive isolation component 320 with a capacitive value of approximately 0.2 pF. In some examples, the size of the PCB capacitor may be arranged to be as small as possible, in order to minimize the current injected in, say, a control board. If two capacitors are used for each of six drivers, the total capacitive value is multiplied by twelve giving a total capacitive value of approximately 2.4 pF. In this example, noting that when the area decreases, the matching decreases comparably, a suitable area may be configured between 0.2 mm$^2$ to 1 mm$^2$.

The first electrically conductive element 322 of the first capacitive isolation component 320 is arranged to receive the boosted control signal 240 from the boost circuit 210. The further electrically conductive element 324 of the first capacitive isolation component 320 is operably coupled to a first input 330 of the driver module 140. In this manner, the first and further electrically conductive elements 322, 324 of the first capacitive isolation component 320 capacitively couple the boosted control signal 240 to the first input 330 of the high voltage driver module 140.

In the illustrated example, the drive module 140 comprises a differential input, whereby a second input 335 of the driver module 140 is operably coupled to the ground plane 305 of the boost circuit 210 via a second capacitive isolation component 325 of the capacitive isolation module 220 to provide a reference voltage therefor. As for the first capacitive isolation component 320, the second capacitive isolation component 325 comprises a first electrically conductive element 327 formed from at least a part of a first PCB layer, and a further electrically conductive element 329 formed from at least a part of at least one further PCB layer. The first and second electrically conductive elements of the second capacitive isolation component 325 are also electrically isolated with respect to one another and arranged to comprise capacitive characteristics there between. In this manner, a differential measure is provided at the input of the driver module 140, thereby enabling a common mode of the driver input to be substantially removed. Such a common mode may comprise, for example in the case of a 1200V load, up to 650V.

In the example illustrated in FIG. 3, the driver module 140 is arranged to drive an (insulated-gate bipolar transistor) device 340; the IGBT device 340 providing a power switching function for a high voltage load 350. Accordingly, an output of the driver module 140 is operably coupled to a gate terminal of the IGBT device 340. In the example illustrated in FIG. 3, the driver module 140 comprises a differential comparator 360. A low voltage power rail 362 for the differential comparator 360 is operably coupled to the emitter junction 345 of the IGBT device 340. A high voltage power rail for the differential comparator 360 is also operably coupled to the emitter junction 345 of the IGBT device 340, via a voltage source 365. In this manner, a floating power supply is provided to the differential comparator 360 that is tied to the emitter 345 of the IGBT device 340.

Figure 6:
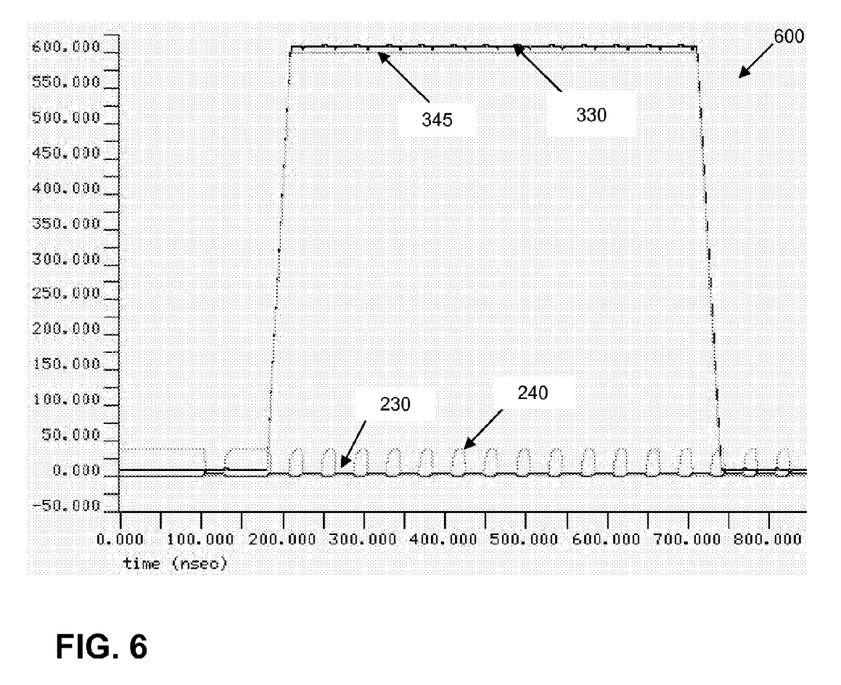
FIG. 6 illustrates a simplified graph showing an example of a simulation of voltage against time for a control signal output by a control module, a boosted control signal output by a boost circuit, a voltage level at an emitter of an IGBT device, and a voltage level at an input of driver module for the IGBT device.

FIG. 6 illustrates a simplified graph 600 showing an example of a simulation of voltage against time (dV/dt) for the 5V control signal 230 output by the control module 120, the boosted control signal 240 output by the boost circuit 210, the voltage level at the emitter 345 of the IGBT device 340, and the voltage level at the input (IN) 330 of the differential comparator 360. As can be seen, in an initial 'off' state, when the IGBT device 340 is switched off, and thereby preventing current flow there through, the voltage level at the emitter 345 of the IGBT device 340 is pulled down to ground through the high voltage load 350. Accordingly, the supply rails 362, 364 for the differential comparator 360 are referenced to this pulled down voltage level. As such, the voltage level at the input (IN) 330 of the differential comparator 360 is also referenced to this pulled down voltage level.

In the illustrated example, two pulses within the boosted control signal 240, and thus the 5V control signal 230, are required to generate an 'on' command for the differential comparator 360 and IGBT device 340. Two pulses are illustrated, as the capacitor only drives pulses (i=CdV/dt), whereas the IGBT device 340 needs to be driven in DC mode. Hence, in this example, with capacitive coupling, a latch may be used to remain the state, where the first pulse latches the 'ON' state ('set') and the second pulse may be configured to un-latch ('reset').

Once the IGBT device 340 is switched on, current is allowed to flow there through, causing the emitter junction voltage to be pulled up to the high voltage supply level, which in the illustrated example results in the voltage level at the emitter 345 of the IGBT device 340 to be pulled up to approximately 600V relative to the ground plane 305. Because the supply rails 362, 364 of the differential comparator 360 are referenced to the emitter 345 of the IGBT device 340, the voltage level at the input (IN) 330 of the differential comparator 360 is also pulled up to this 600V level. The capacitive isolation module 220 isolates the boosted control signal 240 and the 5v control signal 230 from this large rise in voltage level at the input 330 of the differential comparator 360, thereby protecting the low voltage circuitry within the control module 120.

Figure 7:
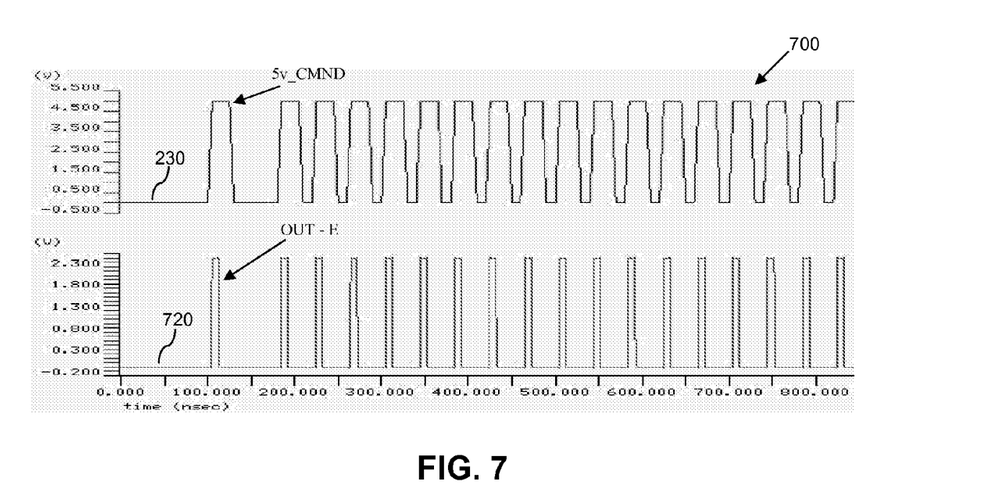
FIG. 7 illustrates a simplified graph showing in more detail the example simulation of voltage against time for the control signal output by the control module, and the relative voltage level at the output of the driver module.

FIG. 7 illustrates a simplified graph 700 showing in more detail the example simulation of voltage against time for the 5V control signal 230 output by the control module 120, and the relative voltage level 720 at the output of the differential comparator 360 (OUT-E). As can be seen from FIG. 7, the control signal 230 comprises a pulsed control signal, with all pulses within the 5V control signal 230 being represented at the output of the differential comparator 360, despite the large 600V common mode transition that occurs at the input of the differential comparator 360 in such a short period of time (e.g. within 30 ns).

Figure 8:
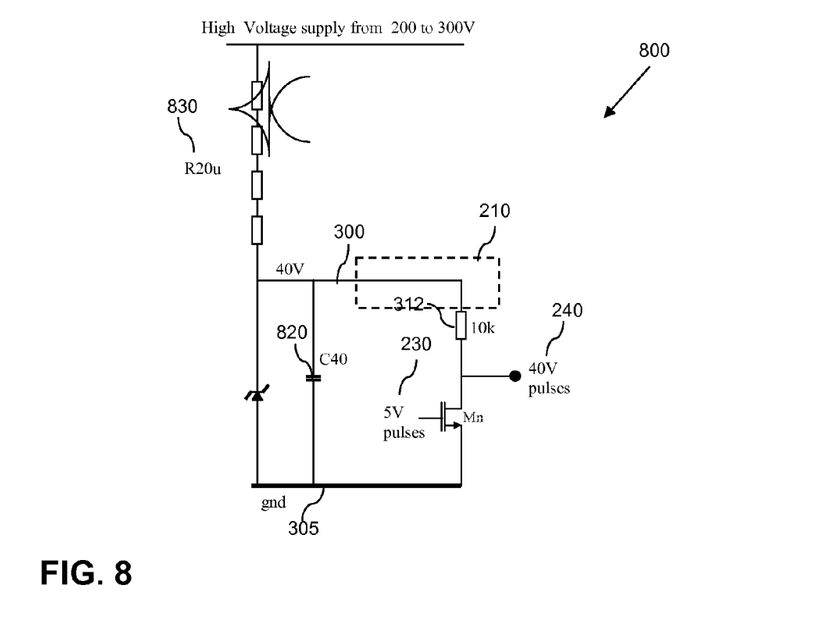
FIG. 8 illustrates a simplified circuit diagram of an example of a simple 40V supply circuit.

Referring now to FIG. 8, there is illustrated a simplified circuit diagram of an example of a simple 40V supply circuit 800 that may be used to provide the 40V supply 300 for the boost circuit 210. In this illustrated example, each pulse of the 5V control signal 230 pulls down 4 mA through the resistor 312, which in the example illustrated in FIG. 8 comprises a 10 kΩ resistance. Two 20 ns pulses are required to generate the on command. In an example implementation, such a 40V supply circuit 800 may be required to supply, say, six driver circuits (i.e. six boost components 210). In such an arrangement, the total charge drawn will be 6*2*20 ns*4 mA=960 pC. A 100 nF capacitor 820 of the 40V supply circuit 800 will experience a voltage drop of 960 pC/100 nF=9.6 mV. The DC current will be 960 pC=Iav*T. So Iav=960 pC/100 u=9.6 us. The resistance R20$u$ 830 could thus be calculated to supply a DC current of 20 uA to 30 uA. For example, if the high voltage supply=200V, R20$u$=8 MΩ for a 20 uA current.

Figure 9:
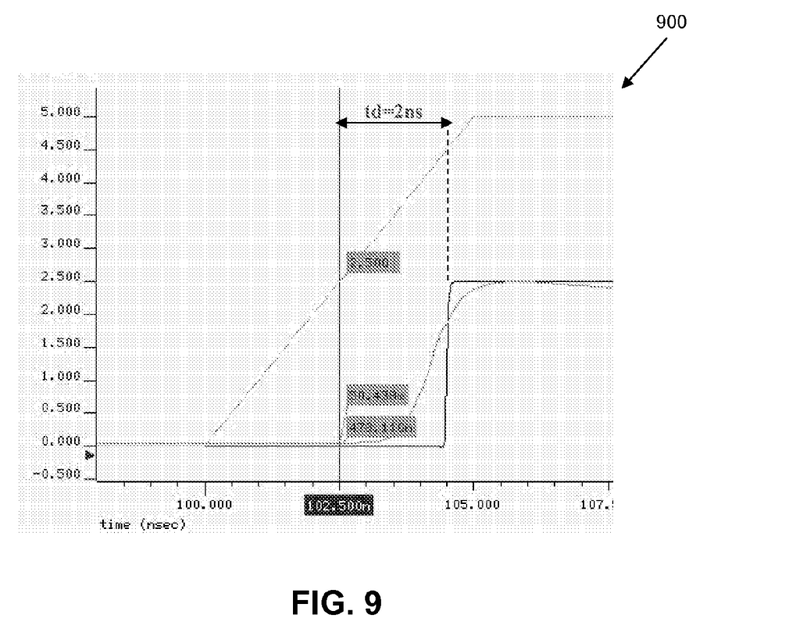
FIG. 9 illustrates a simplified graph of an example of a simulation for the timing delay in generating the control signal.

FIG. 9 illustrates a simplified graph 900 of an example of a simulation for the timing delay in generating the control signal. The control module 120 is able to provide a 5V voltage step in 2 ns, providing a very low command delay. The main part of this delay is due to the NMOS device 310 within the 40V boost circuit 210 requiring 2.5V to pull the current down through the 10 kΩ resistance 312.

Figure 10:
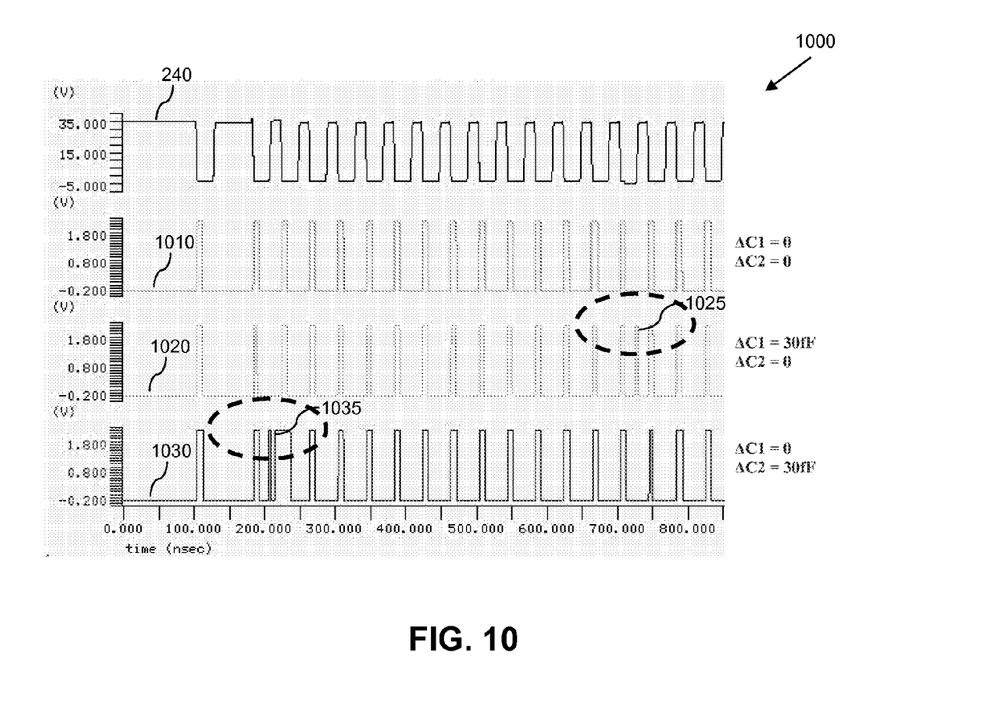
FIG. 10 illustrates a simplified timing diagram showing examples of simulations for the voltage level at the output of the driver module for different capacitive matching scenarios between capacitive isolation components, shown in relation to the voltage against time for the boosted control signal.

FIG. 10 illustrates a simplified timing diagram 1000 showing examples of simulations for the voltage level at the output of the differential comparator 360 (OUT-E) for different capacitive matching scenarios between the first and second capacitive isolation component 320, 325, shown in relation to the voltage against time for the 40V boosted control signal 240. In the illustrated example, each of the first and second capacitive solation components 320, 325 comprises a capacitance of 200 fF. A first simulation 1010 for the voltage level at the output of the differential comparator 360 (OUT-E), in which the first and second capacitive isolation component 320, 325 are ideally matched is illustrated at 1010. In this first simulation, because the first and second capacitive isolation component 320, 325 are ideally matched, the output of the differential comparator 360 (OUT-E) faithfully follows the 40V boosted control signal 240. In contrast, second and third simulations 1020, 1030 show the voltage level at the output of the differential comparator 360 (OUT-E) when a 30 fF error is present between first and second capacitive isolation component 320, 325. As illustrated in FIG. 10, an error starts to appear in the output of the differential comparator 360 (OUT-E) relative to the 40V boosted control signal 240, as illustrated at 1025, 1035 in the respective simulations. These simulations show that it is necessary to create an error of more than 10% (e.g. 20 fF/200 fF) in the matching of the first and second capacitive isolation component 320, 325 to generate an error in the output of the differential comparator 360 (OUT-E). This is in contrast to conventional differential capacitor coupling techniques, which typically can only tolerate a mismatch of around 0.8%. This ability to tolerate such a high mismatch is related to fact that the capacitive input is driven by a 40V boosted control signal, as opposed to the standard 5V control signal.

Figure 11:
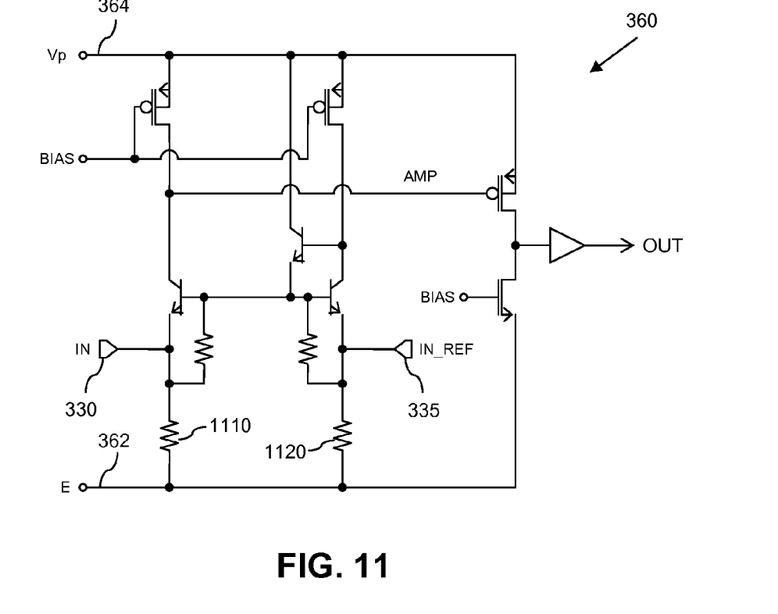
FIG. 11 illustrates a simplified circuit diagram of an example of the driver module.
Figure 12:
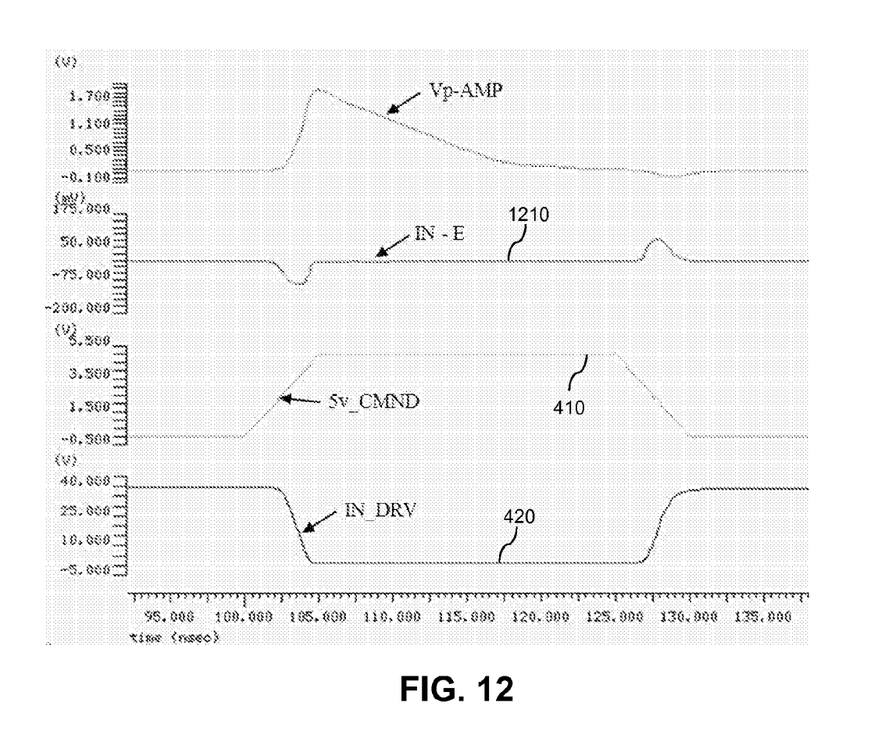
FIG. 12 illustrates a simplified graph comprising the first and second plots from FIG. 4 and a third plot illustrating an example simulation of voltage against time of the dV/dt of the input signal for the driver module.

Referring now to FIG. 11, there is illustrated a simplified circuit diagram of an example of the differential comparator 360. Resistors 1110, 1120 transform the current signals at the differential inputs 330, 335 of the differential comparator 360 into voltage signals. As a result, the comparator 'sees' the dV/dt of the input signal (i=CdV/dt). FIG. 12 illustrates a simplified graph 1200 comprising the first and second plots 410, 420 from FIG. 4 illustrating an example simulation of voltage against time for the 5V control signal 230 output by the control signal 120, and the signal output by the boost circuit 210 illustrated in FIG. 3 comprising the boosted control signal 240 respectively. The graph of FIG. 12 also comprises a third plot 1210 illustrating an example simulation of voltage against time of the dV/dt of the input signal (IN-E). As can be seen from the plot 1210 of FIG. 12, the differential comparator 360 comprises a low impedance input comparator with a 20 mV offset for measuring the difference between inputs.

In of a typically application comprising, say, six driver modules, the total coupling capacitance for the six drivers is 2*0.2 pF*6=2.4 pF (each driver comprising 2*2 pF). Thus, the maximum current for six drivers is I=C*dV/dt=2.4 pF*600/30 n)=48 mA. In a real case, a maximum of three of the six drivers would typically be driven at any one time, and so the maximum current in a real case would typically be half of this value.

In comparison to prior art optical coupling techniques, which typically have a minimum input-output capacitance of 0.6 pF per driver, the capacitive coupling herein described comprises a lower capacitance than a conventional optical coupler, and thus a low current consumption. The same is true when compared with prior art transformer coupling techniques (magnetic coupling), which have by construction capacitive coupling between primary and secondary windings, resulting in a capacitance of ten times that of the present invention herein described.

Furthermore, the capacitive coupling technique herein described comprises a significantly smaller footprint than that of prior art optical and transformer coupling techniques. For example, in one example implementation, the capacitive coupling technique herein described comprises a footprint of 184 mm$^2$, in comparison to a footprint of 300 mm$^2$ for a comparable optical solution.

Figure 13:
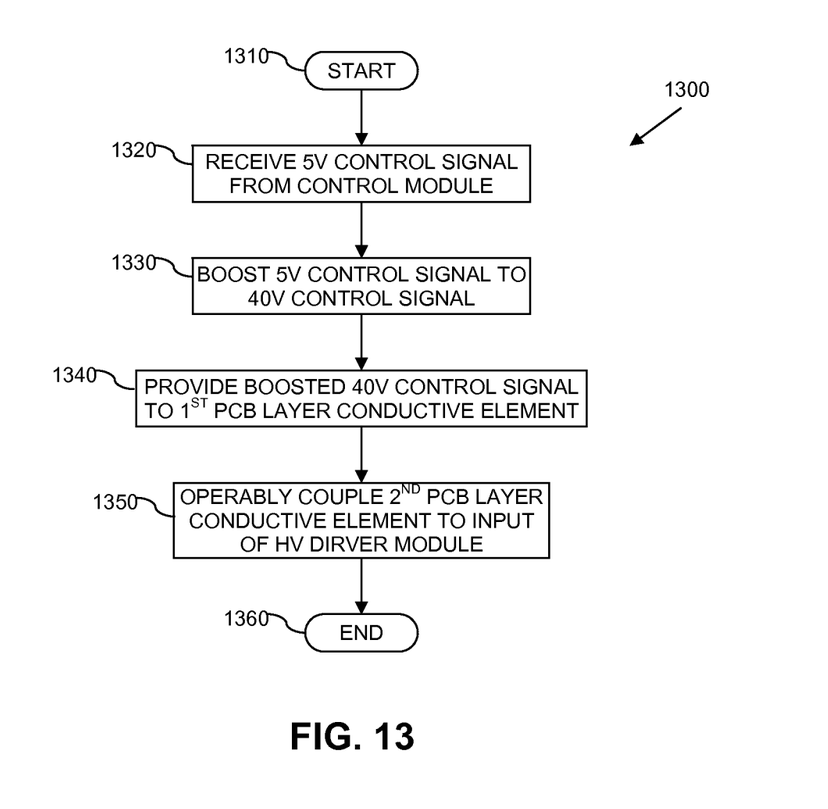
FIG. 13 illustrates a simplified flowchart of an example of a method of providing electrical isolation between at least one control module and at least one driver module.

Referring now to FIG. 13, there is illustrates a simplified flowchart 1300 of an example of a method of providing electrical isolation between at least one control module and at least one driver module, for example such as may be implemented within the isolation circuit 110 illustrated in FIG. 2. The method starts at 1310, and move on to 1320 where a control signal from the control module is received. Next, at 1330, the received control signal is boosted a first voltage level signal, e.g. a 5V signal, to an increased voltage level signal, e.g. a 40V signal. The boosted control signal is the provided to a first electrically conductive element a capacitive isolation component, the first electrically conductive element being formed from first PCB layer. A further electrically conductive element of capacitive isolation component is operably coupled to an input of the driver module, at 1350, the further electrically conductive element being formed from a further PCB layer; wherein the first and further electrically conductive elements are electrically isolated with respect to one another and arranged to comprise capacitive characteristics there between. The method then ends at 1350.

Figure 14:
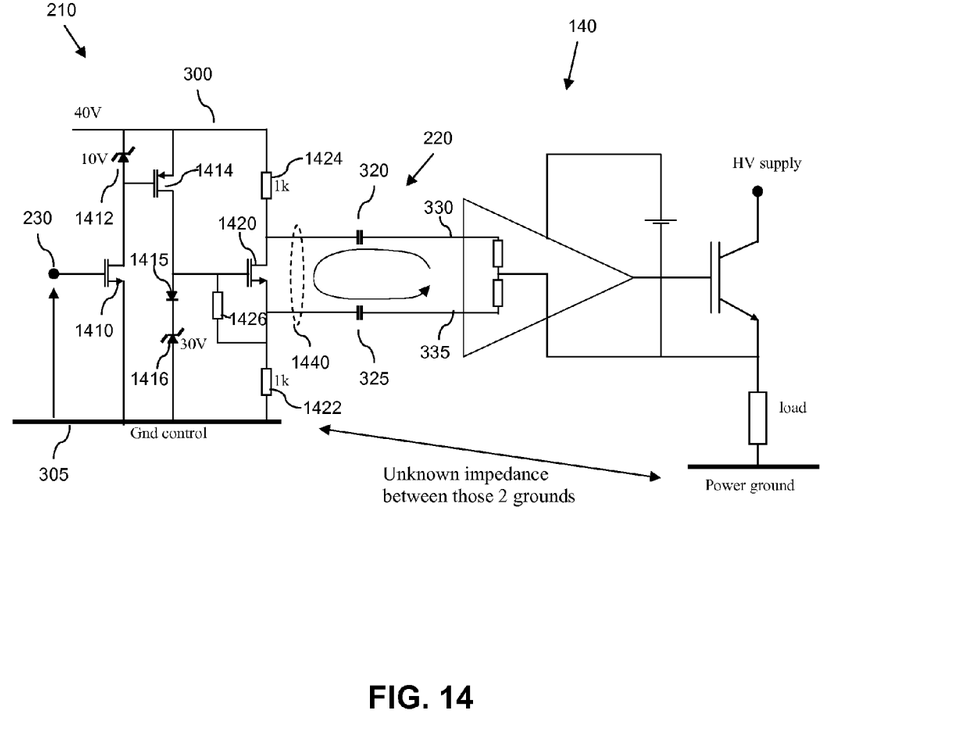
FIG. 14 illustrates a simplified circuit diagram of an alternative example of the part of the high voltage device of FIG. 2.

Referring now to FIG. 14, there is illustrated a simplified circuit diagram of an alternative example of the part of the high voltage device 200 of FIG. 2, comprising an alternative example of a boost circuit 210 and capacitive isolation module 220. In the example illustrated in FIG. 14, the boost circuit 210 is arranged to receive the control signal 230 received from the control module 120 comprising an integrated circuit supply voltage level for the control module 120, which in the illustrated example comprises a 5V voltage level (i.e. comprises a peak amplitude of approximately 5V). The 5V control signal 230 is provided to a gate terminal of an NMOS (negative channel metal oxide semiconductor) transistor device 1410. A source terminal of the first NMOS device 1410 is operably coupled to the ground plane 305, whilst a drain terminal of the first NMOS device 1410 is operably coupled to the 40V voltage supply 300 via a first Zener diode 1412; the first Zener diode 1412 being forward biased towards the 40V voltage supply 300.

In this manner, when a positive voltage is applied to the gate terminal (e.g. greater than a saturation threshold voltage relative to that of the source terminal) of the first NMOS device 1410, the first NMOS device 1410 is biased into an active mode, allowing current to flow there through, pulling the voltage level at the drain terminal down towards the ground voltage level. The voltage drop between the 40V voltage supply 300 and the drain terminal of the first NMOS device 1410 is limited by the breakdown voltage of the first Zener diode 1412, which in the illustrated example comprises a 10V breakdown voltage resulting in a 10V drop between the 40V voltage supply 300 and the drain terminal of the first NMOS device 1410 when the first NMOS device 1410 is biased into an active mode.

Conversely, when a low or negative voltage is applied to the gate terminal (e.g. less than an activation threshold voltage relative to that of the source terminal) of the first NMOS device 1410, the first NMOS device 1410 is biased into a cut-off mode, preventing current flow there through. As a result, when such a low or negative voltage is applied to the gate terminal of the first NMOS device 1410, the drain terminal of the first NMOS device 1410 is pulled up towards the voltage level of the 40V voltage supply 300 via the first Zener diode 1412.

In the illustrated example, the boost circuit 210 of FIG. 14 further comprises a PMOS (positive channel metal oxide semiconductor) transistor device 1414. A source terminal of the PMOS device 1414 is operably coupled to the 40V voltage supply 300, whilst a drain terminal of the PMOS device 1414 is operably coupled to the ground plane 305 via a diode 1415 and a second Zener diode 1416. The diode 1415 is forward biased towards the ground plane 305, whilst the second Zener diode is forward biased towards the drain terminal of the PMOS device 1414. A gate terminal of the PMOS device 1414 is operably coupled to the drain terminal of the first NMOS device 1410.

In this manner, when a positive voltage is applied to the gate terminal of the first NMOS device 1410, biasing the first NMOS device 1410 into an active mode and causing a 10V drop between the 40V voltage supply 300 and the drain terminal of the first NMOS device 1410, the gate terminal of the PMOS device 1414 is also pulled down towards the ground voltage level, resulting in a corresponding 10V drop between the source and gate terminals of the PMOS device 1414. This 10V drop across the source and gate terminals of the PMOS device 1414 biases the PMOS device 1414 into an active mode, allowing current to flow there through and pulling the drain terminal of the PMOS device 1414 up towards the 40V voltage supply 300. In the illustrated example, the second Zener diode 1416 comprises a breakdown voltage of 30V, and thus limits the voltage at the drain of the PMOS device 1414 to 30V (relative to the ground plane 305).

Conversely, when a negative voltage is applied to the gate terminal of the first NMOS device 1410, biasing the first NMOS device 1410 into a cut-off mode, the drain terminal of the first NMOS device 1410 is pulled up towards the 40V voltage supply 300. Accordingly, the gate terminal of the PMOS device 1414 is also pulled up to the 40V voltage supply 300, causing the PMOS device 1414 to be biased into a cut-off mode, preventing current flow there through. As a result, the drain terminal of the PMOS device 1414 is pulled down towards the ground plane 305, via the diode 1415 and second Zener diode 1416.

The boost circuit 210 of FIG. 14 further comprises a second NMOS transistor device 1420. A source terminal of the second NMOS device 1420 is operably coupled to the ground plane 305 via a resistance 1422, whilst a drain terminal of the second NMOS device 1420 is operably coupled to the 40V voltage supply 300 via a resistance 1424. A gate terminal of the second NMOS device 1420 is operably coupled to the drain terminal of the PMOS device 1414. A resistance 1426 is operably coupled between the gate and source terminals of the second NMOS device 1420.

In this manner, when a positive voltage is applied to the gate terminal of the first NMOS device 1410, causing the PMOS device 1414 to be biased into an active mode such that the drain terminal of the PMOS device 1414 is pulled up to a limited voltage of 30V (relative to the ground plane 305), the second NMOS device 1420 is biased into an active mode, allowing current to flow there through, effectively coupling the source and drain terminals to one another.

Conversely, when a low or negative voltage is applied to the gate terminal of the first NMOS device 1410, causing the PMOS device 1414 to be biased into a cut-off mode such that the drain terminal of the PMOS device 1414 is pulled down towards the ground plane 305, the second NMOS device 1420 is also biased into a cut-off mode. As a result, the drain terminal of the second NMOS device 1420 is pulled up towards the 40V supply voltage 300 via resistance 1424, whilst the source terminal of the second NMOS device 1420 is pulled down towards the ground plane 305 via resistance 1422.

In the example illustrated in FIG. 14, the first capacitive isolation component 320 of the capacitive isolation module 220 is operably coupled between the drain terminal of the second NMOS device 1420 and the first input 330 of the driver module 140, whilst the second capacitive isolation component 320 of the capacitive isolation module 220 is operably coupled between the source terminal of the second NMOS device 1420 and the second input 335 of the driver module 140. In this manner, the boost circuit 210 illustrated in FIG. 14 is arranged to convert the received the control signal 230 into a differential boosted control signal 1440 that drives a boosted rate of voltage change (dV/dt) of the signal driving the first and second capacitive isolation components 320, 325. As such, the source and drain terminals of the second NMOS device 1420 comprise differential outputs of the boost circuit 210 illustrated in FIG. 14.

Advantageously, in the differential boosted control signal example illustrated in FIG. 14, the current flowing in the capacitive isolation components 320, 325 may be tightly controlled, since the current flows through a known circuit (i.e. the second NMOS device 1420, capacitive isolation components 320, 325 and the input resistance of the driver module 140). Specifically, the current loop is substantially unaffected by the different ground planes of the boost circuit 210 and the driver module 140. If the current loop for the capacitive isolation components 320, 325 is forced to flow through the different ground planes of the boost circuit 210 and the driver module 140 (such as may be the case in the example illustrated in FIG. 3), the impedance between the ground planes may be substantially unknown, with any parasitic inductance reducing the di/dt.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the control module 120 and booster component 210 have been illustrated and described as separate logical components. However, it will be appreciated that they may be implemented within a single functional block.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the control module 120 and booster component 210 may be implemented within a single integrated circuit device. Alternatively, the examples may be implemented as any number of separate integrated circuits or separate devices interconnected with each other in a suitable manner. For example, the control module 120 and booster component 210 may be implemented within separate integrated circuit devices.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A high voltage device, the high voltage device comprising:
 a high-voltage transistor having a first current terminal to be coupled to a high-voltage supply, a second current terminal to be coupled to a high voltage load, and a control terminal;
 a driver module coupled to the control terminal of the high voltage transistor device;
 an isolation circuit configured to provide electrical isolation to the driver module from a received control signal having a control voltage, the isolation circuit comprising:
 a boost circuit, wherein the boost circuit is configured to receive the control signal at a control input and output a boosted control signal having a boosted control signal voltage, wherein the boosted control signal voltage is at least five times the control signal voltage;
 a first capacitive isolation component formed in a printed circuit board with multiple layers, wherein the first capacitive isolation component comprises:
  a first shielding dielectric layer;
  a first conductive element layer having a first electrically conductive element;
  an intermediate dielectric layer;
  a second conductive element layer having a second electrically conductive element;
  a second shielding dielectric layer
  wherein
   the first electrically conductive element and the second electrically conductive element are electrically isolated with respect to one another by the intermediate dielectric layer and positioned relative to each other to provide a capacitive coupling between the first electrically conductive element and the second electrically conductive element,
   the first conductive element layer abuts the first shielding dielectric layer, and the second shielding dielectric layer abuts the second conductive element layer;
   the first electrically conductive element of the first capacitive isolation component is coupled to the boost circuit to receive the boosted control signal from the boost circuit,
   the second electrically conductive element of the first capacitive isolation component is operably coupled to a first input of the driver module to provide the boosted control signal to the driver module over the capacitive coupling, and
   the driver module drives the control terminal of the high voltage transistor device according to the boosted control signal to drive the high voltage transistor device to provide a high voltage to the high voltage load, the high voltage an order of magnitude greater than the boosted control signal voltage.

2. The high voltage device of claim 1, wherein the control signal comprises a pulsed control signal.

3. The high voltage device of claim 1, wherein the control signal comprises an integrated circuit supply voltage level for a control module.

4. The high voltage device of claim 3, wherein the control signal comprises a 5V voltage level.

5. The high voltage device of claim 1, wherein the boost circuit boosts a rate of change of voltage.

6. The high voltage device of claim 5, wherein the boost circuit provides a highest available rate of change of voltage to drive the first capacitive isolation component.

7. The high voltage device of claim 1, wherein the boost circuit boosts the control signal to up to a 40V voltage level.

8. The high voltage device of claim 1, wherein the isolation circuit comprises at least one further capacitive isolation component operably coupled between a ground plane and at least one further input of the at least one driver module, wherein the first and at least one further input of the at least one driver module comprise a differential input.

9. The high voltage device of claim 1, wherein the boost circuit is arranged to output a differential boosted control signal, and the isolation circuit comprises the first capacitive isolation component and at least one further capacitive isolation component; wherein the first and at least one further capacitive isolation component are operably coupled between differential outputs of the boost circuit and differential inputs of the at least one driver module.

10. The high voltage device of claim 1, wherein the electrically conductive elements of the first capacitive isolation component are formed from internal PCB layers.

11. The high voltage device of claim 1, wherein each of the first and second electrically conductive elements of the first capacitive isolation component comprise an area of between 1 mm$^2$ to 0.2 mm$^2$.

12. The high voltage device of claim 11, wherein each of the first and second conductive elements of the first capacitive isolation component comprise an area of 1 mm$^2$.

13. The high voltage device of claim 1, wherein the driver module comprises a differential comparator.

14. The high voltage device of claim 1, wherein a low voltage power rail for the differential comparator is coupled to an emitter junction of the high voltage transistor device, and a high voltage power rail for the differential comparator is coupled to the emitter junction of the high voltage transistor device.

15. A method comprising:
 receiving a control signal at a boost circuit;
 boosting the control signal from a first voltage level to an increased voltage level at the boost circuit to generate a boosted control signal, wherein the increased voltage level is at least five times the first voltage level;
 providing the boosted control signal to a first electrically conductive element of a first capacitive isolation component formed in a printed circuit board having multiple layers, wherein the first electrically conductive element is formed in a first conductive element layer of the printed circuit board;
 receiving the boosted control signal at a second electrically conductive element of the first capacitive isolation component via a capacitive coupling with the first electrically conductive element, the second electrically conductive element separated from the first electrically conductive element by a dielectric layer of the printed circuit board, wherein the second electrically conductive element is formed in a second conductive element layer of the printed circuit board;
 providing the boosted control signal to a driver module via the second electrically conductive element;
 driving a control terminal of a high voltage transistor device with the driver module based on the boosted control signal to provide a high voltage, the high voltage an order of magnitude greater than the increased voltage level.

16. A method comprising:

receiving a boosted control signal at a first electrically conductive element of a first capacitive isolation component formed in a printed circuit board having multiple layers, wherein the first electrically conductive element is formed in a first conductive element layer of the printed circuit board, and the boosted control signal has a boosted control signal voltage at least five times a control signal voltage of a control signal;

receiving the boosted control signal at a second electrically conductive element of the first capacitive isolation component over a capacitive coupling with the first electrically conductive element, the second electrically conductive element separated from the first electrically conductive element by a dielectric layer of the printed circuit board, wherein the second electrically conductive element is formed in a second conductive element layer of the printed circuit board;

providing the boosted control signal to a driver module via the second electrically conductive element; and driving a control terminal of a high voltage transistor device with the driver module based on the boosted control signal to provide a high voltage, the high voltage an order of magnitude greater than the boosted control signal voltage.

\* \* \* \* \*